United States Patent [19]

Miller

[11] 4,046,565

[45] Sept. 6, 1977

[54] AMORPHOUS SELENIUM COATING

[75] Inventor: Norman Carlile Miller, Shaker Heights, Ohio

[73] Assignee: Addressograph Multigraph Corporation, Cleveland, Ohio

[21] Appl. No.: 561,702

[22] Filed: Mar. 25, 1975

[51] Int. Cl.$^2$ .............................................. G03G 5/04
[52] U.S. Cl. ..................................... 96/1.5 R; 96/1 R; 427/76; 427/83; 427/250
[58] Field of Search .................. 96/1.5, 1 R; 427/76, 427/83, 250

[56] References Cited

U.S. PATENT DOCUMENTS

| 2,739,079 | 3/1956 | Keck | 427/76 |
|---|---|---|---|
| 2,753,278 | 7/1956 | Bixby et al. | 427/76 X |
| 3,761,308 | 9/1973 | Galli | 427/76 |
| 3,771,866 | 11/1973 | Ogawa | 96/1.5 C |
| 3,793,069 | 2/1974 | Shimizu et al. | 427/76 |
| 3,986,871 | 10/1976 | Blades et al. | 96/1 R |

FOREIGN PATENT DOCUMENTS

| 43-16198 | 7/1968 | Japan | 96/1.5 |

*Primary Examiner*—Thomas J. Herbert, Jr.
*Attorney, Agent, or Firm*—Michael A. Kondzella

[57] ABSTRACT

A photoconductive coating having an improved charge acceptance is produced by vacuum evaporation of amorphous selenium in the presence of an inert gas.

11 Claims, No Drawings

AMORPHOUS SELENIUM COATING

BACKGROUND OF THE INVENTION

This invention relates to electrophotographic processes and apparatus. In one of its more particular aspects this invention relates to an improved photoconductive coating and the process for producing such coating.

Electrophotographic processes for making copies of graphic originals using photoconductive media are well known. The basic process consists of applying a blanket electrostatic charge to a photoconductor in the dark and then exposing the charged photoconductor to a pattern of light and shadow created by directing electromagnetic radiation onto a graphic original. The light-struck areas of the photoconductor are thereby discharged leaving a latent electrostatic image corresponding to the original. A developed image is produced by applying an electroscopic powder to the latent electrostatic image and then fixing the image or transferring and fixing onto a suitable receiving medium such as plain paper. Variations of this process have also been utilized.

One such variation consists of the use of foraminated structures formed by applying a photoconductive layer to a conductive screen, grid or similar apertured substrate. Such structures function as ion modulators which can be made to selectively pass a stream of charged particles through the apertures in a pattern corresponding to a graphic original.

A simple two-layered screen construction formed by applying a photoconductive layer onto an apertured metallic substrate is disclosed in U.S. Pat. No. 3,220,324 to Christopher Snelling. This screen can be used to apply an electrostatic charge pattern to a dielectric target. The pattern applied corresponds to the pattern of light and shadow created by electromagnetic radiation of a graphic original.

Many different types of both organic and inorganic photoconductors have been used in electrophotographic processes. However, because of its desirable electrical properties, selenium is the most widely used photoconductor.

Selenium is generally applied to surfaces to form a photoconductive layer thereon by techniques of evaporation or sputtering. In evaporation techniques selenium is heated and the vapors are condensed upon the desired substrate. Evaporation is generally conducted under a vacuum of $10^{-5}$ torr or better in order to minimize the amount of gaseous impurities present which adversely affect the photoconductive properties of the selenium applied.

In sputtering a selenium cathode is caused to sputter selenium atoms upon a substrate by application of a high radio frequency (r.f.) electrical potential between the cathode and an anode, between which the substrate is placed. Sputtering is also accomplished under a vacuum in the presence of an inert gas.

In general, selenium layers having thicknesses in the range of about from 10 microns to 200 microns are produced by means of the known evaporation and sputtering methods. However, with these relatively large thicknesses, it has sometimes been found that the current carrier range is inadequate resulting in the trapping of electrons or holes and the consequent failure to meet performance expectations.

It has also been difficult in the past to obtain uniform selenium coatings especially when using foraminated substrates.

OBJECTS

A principal object of this invention is to provide an improved process for coating surfaces with photoconductive materials.

Another object of this invention is to provide a means for uniformly applying thin layers of selenium to irregular surfaces.

Another object of this invention is to provide a process for coating foraminated surfaces such as screens or grids.

A further object of this invention is to provide a method for coating screens with selenium to provide an ion modulator having a high charge acceptance.

Other objects and advantages of this invention will become apparent in the course of the following detailed disclosure and description.

SUMMARY OF THE INVENTION

Amorphous selenium is vacuum evaporated in the presence of an inert gas and caused to deposit uniformly upon an irregular surface such as a plate having pronounced hills and valleys, a screen or a grid. The coated surface resulting has a charge acceptance nearer the dielectric breakdown charge acceptance than was previously obtainable. In addition, carrier range requirements are relaxed by a substantial factor and quantum efficiency is maximized.

DESCRIPTION OF THE PREFERRED EMBODIMENT

High purity amorphous selenium, that is, selenium having a purity of 99.999% or better, is placed in a conical or rectangular boat of tantalum, molybdenum, or stainless steel, which constitutes the evaporation source in a high vacuum system which can be oil diffusion pumped, turbomolecular pumped or ion pumped. Oil diffusion pumped vacuum systems are preferred because of their reliability and because they sustain high throughput of the inert gas used. The selenium can be utilized in any convenient form, for example, as pellets. The evaporation source is provided with a means for heating the selenium which is to be evaporated. A surface to be coated with selenium is inserted into a holder placed at the desired distance from the evaporation source and generally coplanar with the source. The holder may be provided with heating elements if desired in order to heat the surface upon which the selenium is to be deposited, such as a metallic screen, to the desired temperature, for example, a temperature in the range of from 50° to 60° C.

The vacuum system is pumped down to the low $10^{-6}$ torr range and the selenium pellets are melted and degassed by resistive heating of the evaporation source to a temperature in the range of about 170° to 250° C. A shutter is provided for blocking the substrate from the evaporation source. The temperature of the boat is controlled to give the desired rate of deposition of selenium upon the substrate. The thickness of the selenium deposited can be measured by means of a quartz crystal thickness monitor adjacent to the substrate or other known means.

An inert gas of high purity, for example helium, neon, argon, krypton or xenon, preferably argon having a purity of 99.999% or better, is admitted into the high vacuum system by means of a leak valve in a manner such that an inert gas pressure in the range of about from $1 \times 10^{-4}$ torr to $6 \times 10^{-2}$ torr is set and held. Preferably, a pressure in the range of about from $1 \times 10^{-3}$ torr to $3 \times 10^{-2}$ torr is used. High argon throughput is maintained to minimize the presence of gas impurities which might otherwise be incorporated into the selenium film.

The shutter is opened and the selenium being vaporized from the boat is deposited upon the screen or other substrate. When the desired thickness is obtained as indicated on the thickness monitor, the film deposition is stopped by closing the shutter and cooling the boat.

The inert gas in the system functions to scatter the evaporating selenium atoms from about 5 to 150 times before landing on the substrate. The number of collisions can be controlled by controlling the pressure and the boat to substrate distance. The result of the multi-collision path of the selenium atoms from the source to the substrate is that the evaporated selenium atoms are caused to strike the substrate from all angles. The selenium film which is formed in the process is thus caused to follow the contours of the substrate. For example, the entire area of the wires of a woven or electroformed screen can be uniformly coated in this manner.

The source to substrate distance is adjusted so that it constitutes many mean free paths for the selenium atoms, for example, a distance of about from 5 inches to 20 inches can be used effectively.

The process has the advantage over conventional thermal evaporations of more uniform deposition of selenium upon the substrate than is the case in previously used thermal evaporation processes. Another advantage over prior art evaporative methods is in obviating the necessity of tilting and rotating the substrate in attempting to obtain a more uniform deposition upon all regions thereof. The process of this invention has the advantages over r.f. sputtering of not requiring the fabrication of a sputtering target, having a higher deposition rate and dissipating little power. In addition, it is unnecessary to cool the substrate as was the case in prior deposition processes. Where r.f. plasma was used the substrate needed to be cooled to at least $-50°$ C. due to power dissipated into the substrate by the plasma.

The breakdown voltage of planar selenium film under corona charging conditions in the dark is generally found to be around 40 volts per micron. Previously, films formed upon irregular and foraminated surfaces by evaporating selenium at normal incidence onto a stationary substrate were found to charge to about from 1 to 3 volts per micron and to have a charge acceptance of from 1/13 to 1/40 of the breakdown voltage. The charge acceptance was improved somewhat for this type of film by tilting and rotating the screen during evaporation in which case the selenium film charged to about 4 to 6 volts per micron. That is, the charge acceptance was about 1/10 to 1/8 of the original breakdown voltage. By using the process of this invention the charge acceptance has been found to reach levels nearer the breakdown voltage. For example, as the argon pressure is increased from about $1 \times 10^{-3}$ torr to $3 \times 10^{-2}$ torr, the charge acceptance varies from about 1/5 to 1/3 of the breakdown voltage or from about 8 to 14 volts per micron. With this higher charge acceptance it is possible to use significantly thinner selenium films to achieve a desired level of charge. The final result may accordingly be on the order of about 50 to 100 volts.

The desirability of thinner selenium films can be understood when it is realized that the various grades of selenium which are available have correspondingly different carrier ranges. In order to provide the desired electrical properties in the selenium film used, for example, in an ion modulator, the carrier range, that is, the distance the electrons or holes will travel before being trapped in the presence of the high charge acceptance field of the photoconductor, must be equal to or greater than the film thickness.

With respect to electrical properties the selenium films of this invention have a sensitivity, that is, the energy for decay to 0.3 times the charge acceptance, of about 1 microjoule per square centimeter for holes and 2 microjoules per square centimeter for electrons. This is due to the high purity of the films prepared according to the process of this invention. In contrast, radio frequency sputtered selenium films are at least 20 times slower for positive corona charging and 100 times slower for negative corona charging.

Although it has been specified that uniformity of coating is a desired end in the instant invention there may be situations when it is desired to apply a thicker coating of selenium on one side of the screen and a thinner coating on the back side thereof. This may be desirable in the case of screens displaying memory properties, for example, the screens disclosed in co-pending application Ser. No. 423,883 filed Dec. 12, 1973, now U.S. Pat. No. 3,986,871 by John D. Blades and Jerome E. Jackson. In this type of screen a thinner film of selenium is desired on the back side than on the front of the screen in order to ensure adequate charge acceptance and at the same time prevent unblocking in dark areas of the image. In order to provide such film thickness variations it has been found desirable to place a metal plate a certain distance behind the screen and to control the relative deposition of selenium on the front and back of the screen by adjusting the argon pressure, the boat to screen distance, and the distance behind the screen at which the plate is positioned. Typically, the charge acceptance on the front of the screen may be on the order of around 50 volts while the charge acceptance on the back of the screen is 5 volts or less for coatings made by this process.

The following examples illustrate the invention.

EXAMPLE 1

A vacuum system was equipped with an oil diffusion pump, a rectangular tantalum boat, a shutter at a distance of 2 inches from the boat and a substrate holder with a heating element at a distance of 10 inches from the boat and coplanar therewith. Twenty grams of 1/8 inch diameter selenium pellets having a purity of 99.999%, was placed in the boat and a woven aluminum screen, the wire diameter of which was 2 mils and the aperture size 3 mils was placed in the substrate holder. The system was evacuated to a pressure of $10^{-6}$ torr and the selenium pellets were melted and de-gassed by heating the boat to 250° C. with the shutter blocking the screen from the boat. The screen was maintained at a temperature of 50° to 60° C. by means of the heating element of the substrate holder. Argon gas of a purity of 99.999% was admitted to the system by means of a leak valve until the argon pressure was $2 \times 10^{-3}$ torr. Argon throughput was maintained by holding the pressure at this level. The shutter was opened and deposition of selenium upon the screen was continued until a thickness of 5 microns to 12 microns was deposited. The shutter was then closed and the boat allowed to cool.

The resulting selenium coated screen was removed from the vacuum system and corona charged in air in the dark using a positive corona having a potential of +5000 volts at a distance of ⅜ inch from the screen. The charge acceptance was found to be 8 volts per micron and the sensitivity was 1 microjoule per square centimeter.

EXAMPLE 2

The procedure of Example 1 was repeated except that the corona used was a negative corona having a potential of −6000 volts. Charge acceptance was found to be −8 volts per micron and the sensitivity was 2 microjoules per square centimeter.

EXAMPLE 3

The procedure of Example 1 was followed except that the pressure of argon was maintained at $3 \times 10^{-2}$ torr. The charge acceptance was found to be 14 volts per micron and the sensitivity was 1 microjoule per square centimeter.

In a similar experiment using a negative corona having a potential of −6000 volts, the sensitivity was also found to be 1 microjoule per square centimeter.

EXAMPLE 4

The procedure of Example 1 was followed except that a plate formed of copper, having dimensions slightly larger than the screen, was placed at a distance of ¼ inch behind the screen. The argon pressure was $1 \times 10^{-3}$ torr, the boat to screen distance 10 inches. Upon removing the screen from the vacuum evaporation system, the charge acceptance determined in accordance with the procedure of Example 1 was found to be 50 volts on the front and 5 volts on the back.

This invention has been described with reference to specific embodiments and to various suggested conditions of operation. However, other embodiments can be utilized to achieve the results of this invention. It is therefore intended that this invention is not to be limited except as defined in the following claims.

What is claimed:

1. A process for depositing a layer of photoconductive amorphous selenium upon a substrate which comprises evaporating amorphous selenium at a temperature in the range of about from 170° to 250° C at a pressure in the range of about from $1 \times 10^{-4}$ torr to $6 \times 10^{-2}$ torr, introducing an inert gas into an evacuated system having a pressure in the range of about from $1 \times 10^{-7}$ torr to $1 \times 10^{-6}$ torr, thus scattering said amorphous selenium and condensing amorphous selenium upon the entire surface of said substrate, the charge acceptance of the resulting selenium layer being in the range of about from 1/5 to ⅓ of the dielectric breakdown voltage.

2. A process according to claim 1 wherein the amorphous selenium has a purity of at least about 99.999%.

3. A process according to claim 1 wherein the pressure at which the selenium is evaporated is in the range of about from $1 \times 10^{-3}$ torr to $3 \times 10^{-2}$ torr.

4. A process according to claim 1 wherein the charge acceptance of the selenium layer is about from 8 to 14 volts per micron.

5. A process according to claim 1 wherein the selenium is deposited upon the front surface of said substrate in a layer which is thicker than the layer deposited upon the back surface thereof.

6. A process according to claim 1 wherein the inert gas is argon.

7. A process according to claim 6 wherein the inert gas has a purity of about 99.999%.

8. A process according to claim 1 wherein the substrate is metallic.

9. A process according to claim 8 wherein the substrate is a metallic surface having a foraminated structure.

10. A photoconductive selenium coated substrate produced by a process which comprises evaporating amorphous selenium at a temperature in the range of about from 170° to 250° C at a pressure in the range of about from $1 \times 10^{-4}$ torr to $6 \times 10^{-2}$ torr, introducing an inert gas into an evacuated system having a pressure in the range of about from $1 \times 10^{-7}$ torr to $1 \times 10^{-6}$ torr, thus scattering said amorphous selenium and condensing amorphous selenium upon the entire surface of said substrate, the charge acceptance of the resulting selenium layer being in the range of about from 1/5 to 1/3 of the dielectric breakdown voltage.

11. A product according to claim 10 wherein the selenium is deposited upon the front surface of said substrate in a layer which is thicker than the layer deposited upon the back surface thereof.

* * * * *